US006693468B2

(12) United States Patent
Humphreys et al.

(10) Patent No.: US 6,693,468 B2
(45) Date of Patent: Feb. 17, 2004

(54) FRACTIONAL-N SYNTHESIZER WITH IMPROVED NOISE PERFORMANCE

(75) Inventors: Scott Robert Humphreys, Greensboro, NC (US); Alex Wayne Hietala, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 09/879,672

(22) Filed: Jun. 12, 2001

(65) Prior Publication Data

US 2002/0186055 A1 Dec. 12, 2002

(51) Int. Cl.[7] ............................................. H03B 21/00
(52) U.S. Cl. ..................................... 327/105; 327/107
(58) Field of Search ................................. 327/100, 105, 327/106, 107; 331/1 A, 10

(56) References Cited

U.S. PATENT DOCUMENTS

| 3,538,450 A | 11/1970 | Andrea et al. ................. 331/10 |
| 4,609,881 A | 9/1986 | Wells ........................... 331/1 A |
| 4,758,802 A | * 7/1988 | Jackson ......................... 331/10 |
| 4,875,046 A | 10/1989 | Lewyn ......................... 341/148 |
| 4,920,282 A | 4/1990 | Muraoka et al. ............. 307/442 |
| 4,953,187 A | 8/1990 | Herold ......................... 337/48 |
| 4,965,474 A | 10/1990 | Childers et al. ............. 307/542 |
| 4,965,531 A | 10/1990 | Riley ........................... 331/1 A |
| 4,991,187 A | 2/1991 | Herold ......................... 337/48 |
| 5,022,054 A | 6/1991 | Wang ........................... 375/64 |
| 5,038,117 A | 8/1991 | Miller .......................... 331/16 |
| 5,055,800 A | 10/1991 | Black ........................... 331/1 A |
| 5,055,802 A | 10/1991 | Hietala ......................... 331/16 |
| 5,058,427 A | 10/1991 | Brandt ......................... 73/384 |
| 5,068,875 A | 11/1991 | Quintin ......................... 375/78 |
| 5,070,310 A | 12/1991 | Hietala ......................... 331/1 A |
| 5,079,522 A | 1/1992 | Owen ........................... 331/16 |
| 5,093,632 A | 3/1992 | Hietala ......................... 331/1 A |
| 5,111,162 A | 5/1992 | Hietala ......................... 332/127 |
| 5,117,206 A | 5/1992 | Imamura ...................... 331/158 |
| 5,166,642 A | 11/1992 | Hietala ......................... 331/1 A |
| 5,235,335 A | 8/1993 | Hester et al. ................ 341/172 |
| 5,281,865 A | 1/1994 | Yamashita ................... 307/279 |
| 5,301,367 A | 4/1994 | Heinonen ..................... 455/76 |
| 5,337,024 A | 8/1994 | Collins ......................... 332/127 |
| 5,341,033 A | 8/1994 | Koker .......................... 307/290 |
| 5,365,548 A | 11/1994 | Baker ........................... 375/62 |

(List continued on next page.)

OTHER PUBLICATIONS

Chang, Byngsoo, et al. "A 1.2 GHz CMOS Dual–Modulus Prescaler Using New Dynamic D–Type Flip–Flops," IEEE Journal of Solid–State Circuits, vol. 31, No. 5, May, 1996, pp. 749–752.

Huang, Qiuting, and Rogenmoser, Robert, "Speed Optimization of Edge–Triggered CMOS Circuits for Gigahertz Single–Phase Clocks," IEEE Journal of Solid–State Circuits, vol. 31, No. 3, Mar., 1996, pp. 456–465.

Motorola Semiconductor Technical Data, "The Technique of Direct Programming by Using a Two–Modulus Prescaler," Originally printed May 1981, reformatted Oct. 1995, Document No. AN827/D.

(List continued on next page.)

Primary Examiner—Timothy P. Callahan
Assistant Examiner—Cassandra Cox
(74) Attorney, Agent, or Firm—Withrow & Terranova, PLLC

(57) ABSTRACT

A fractional sequence generator having a plurality of cascaded accumulators whose carry-outs-upon-overflow are provided over a plurality of recombination paths and selective delays to an adder, the pattern of selective delays being modified by the addition of delay elements in all recombination paths except the last to reduce the number of quantization error terms in the transfer function of the sequence generator. Illustrative embodiments may have any number (greater than one) of accumulators and recombination paths, while continuing to exhibit desired simplified frequency response characteristics.

10 Claims, 3 Drawing Sheets

U.S. PATENT DOCUMENTS

| | | | | |
|---|---|---|---|---|
| 5,448,191 A | * | 9/1995 | Meyer | 327/105 |
| 5,493,700 A | | 2/1996 | Hietala | 455/75 |
| 5,493,715 A | | 2/1996 | Humphreys et al. | 455/264 |
| 5,495,206 A | | 2/1996 | Hietala | 331/1 A |
| 5,552,738 A | | 9/1996 | Ko | 327/203 |
| 5,563,532 A | | 10/1996 | Wu et al. | 327/34 |
| 5,563,535 A | * | 10/1996 | Corry et al. | 327/105 |
| 5,592,114 A | | 1/1997 | Wu | 327/208 |
| 5,684,795 A | | 11/1997 | Daniel | 370/347 |
| 5,745,848 A | | 4/1998 | Robin | 455/296 |
| 5,777,521 A | | 7/1998 | Gillig | 331/16 |
| 5,778,028 A | | 7/1998 | Turner | 375/229 |
| 5,822,366 A | | 10/1998 | Rapeli | 375/219 |
| 5,825,257 A | | 10/1998 | Klymyshyn | 332/100 |
| 5,847,611 A | * | 12/1998 | Hirata | 331/1 A |
| 5,857,004 A | | 1/1999 | Abe | 375/344 |
| 5,859,890 A | | 1/1999 | Shurboff | 377/48 |
| 5,883,930 A | | 3/1999 | Fukushi | 375/376 |
| 5,892,385 A | | 4/1999 | Hashiguchi | 327/333 |
| 5,898,330 A | | 4/1999 | Klass | 327/210 |
| 5,900,758 A | | 5/1999 | Kanno | 327/201 |
| 5,903,194 A | * | 5/1999 | Opsahl et al. | 327/107 |
| 5,917,355 A | | 6/1999 | Klass | 327/208 |
| 5,920,556 A | | 7/1999 | Jorgensen | 370/350 |
| 5,933,038 A | | 8/1999 | Klass | 327/208 |
| 5,943,613 A | | 8/1999 | Wendelrup | 455/343 |
| 5,973,633 A | | 10/1999 | Hester | 341/172 |
| 6,008,703 A | | 12/1999 | Perrott | 332/100 |
| 6,008,704 A | | 12/1999 | Opsahl | 332/127 |
| 6,043,696 A | | 3/2000 | Klass | 327/211 |
| 6,060,927 A | | 5/2000 | Lee | 327/218 |
| 6,064,272 A | | 5/2000 | Rhee | 331/16 |
| 6,069,535 A | * | 5/2000 | Khlat | 331/1 A |
| 6,097,259 A | | 8/2000 | Saito | 332/103 |
| 6,100,730 A | | 8/2000 | Davis | 327/117 |
| 6,121,807 A | | 9/2000 | Klass | 327/218 |
| 6,154,077 A | | 11/2000 | Waible | 327/185 |
| 6,163,710 A | | 12/2000 | Blaser | 455/552 |
| 6,262,604 B1 | * | 7/2001 | Gabet et al. | 327/105 |
| 6,275,083 B1 | | 8/2001 | Martinez et al. | 327/218 |
| 6,323,709 B1 | | 11/2001 | Kulkarni et al. | 327/195 |

OTHER PUBLICATIONS

Owen, David, "Fractional–N Synthesizers," IFR Application Note, IFR Americas, 2001, www.ifrsys.com.

Pohjonen, H. and Ronkainen, H., "A 1 GHz CMOS Prescaler for RF Synthesizers," 1988 Proceedings of ISCAS, pp. 377–380, CH2458–8/88/0000–0377.

Rogenmoser, R. et al., "1.57 GHz Asynchronous and 1.4 GHz Dual–Modulus 1.2 micrometer CMOS Prescalers," IEEE Customer Integrated Circuits Conference, 1994, pp. 387–390, 0–7803–1886–2/94.

Yang, Ching–Yuan, and Liu, Shen–Iuan, "Fast–Switching Frequency Synthesizer with a Discriminator–Aided Phase Detector," IEEE Journal of Solid–State Circuits, vol. 35, No. 10, Oct. 2000, pp. 1445–1452, 0018–9200/00.

Yuan, Jiren, and Svensson, Christer, "High–Speed CMOS Circuit Technique," IEEE Journal of Solid–State Circuits, vol. 24, No. 1, Feb. 1989, pp. 62–70, 0018–9200/89.

Yuan, Jiren and Svensson, Christer, "New Single–Clock CMOS Latches and Flipflops with Improved Speed and Power Savings," IEEE Journal of Solid–State Circuits, vol. 32, No. 1, Jan. 1997, pp. 62–69, 0018–9200/97.

Razavi, Behzad, "RF Microelectronics," Prentice Hall PTR, Upper Saddle River, NJ, 1998.

Dunning et al., "An All–Digital Phase–Locked Loop with 50–Cycle Lock Time Suitable for High–Performance Microprocessors," IEEE Journal of Solid–State Circuits, vol. 30, No. 4, Apr. 1999, pp. 412–422.

Kral et al., "RF–CMOS Oscillators with Switched Tuning," Proceedings of the IEEE 1998 Custom Integrated Circuits Conference, May 1998, pp. 555–558.

Miller, Brian and Conley, Robert J., "A Multiple Modulator Fractional Divider," IEEE Transactions on Instrumentation and Measurement, vol. 40, No. 3, Jun. 1991, pp. 578–583.

Wilson et al., "A CMOS Self–Calibrating Frequency Synthesizer," IEEE Journal of Solid–State Circuits, vol. 35, No. 10, Oct. 2000, pp. 1437–1444.

* cited by examiner

FRACTIONAL-N SYNTHESIZER WITH IMPROVED NOISE PERFORMANCE

RELATED APPLICATIONS

The present application is related to concurrently filed non-provisional applications:
(i) 09/879,806 by A. W. Hietala entitled Fractional-N Modulation with Analog IQ Interface having been flied on Jun. 12, 2001;
(ii) 09/879,670 by B. T. Hunt and S. R. Humphreys entitled Dual-Modulus Prescaler having been filed on Jun. 12, 2001;
(iii) 09/879,808 by S. R. Humphreys and A. W. Hietala entitled Accumulator with Programmable Full-Scale Range having been filed on Jun. 12, 2001; and
(iv) 09/879,671 by B. T. Hunt and S. R. Humphreys entitled True Single-Phase Flip-Flop having been flied on Jun. 12, 2001;
which non-provisional applications are assigned to the assignee of the present invention, and are hereby incorporated in the present application as if set forth in theft entirety herein.

FIELD OF THE INVENTION

The present invention relates to frequency synthesizers. More particularly, the present invention relates to fractional-N (F-N) frequency synthesizers for use in radio frequency (RF) applications, such as mobile radiotelephones. Still more particularly, the present invention relates to RF F-N frequency synthesizers with improved noise performance.

BACKGROUND OF THE INVENTION

Phase-locked loop (PLL) frequency synthesis is a well-known technique for generating a variety of signals of predetermined frequency in many applications, e.g., digital radiotelephone systems. Briefly, the output of a voltage-controlled oscillator (VCO) is coupled to a frequency divider for providing one input to a phase detector. Another input to the phase detector is a reference signal from a fixed frequency source having high stability over a range of operating conditions. Differences in phase determined by the phase detector (typically reflected as charge pulses) are then filtered and applied to the VCO to control changes to the frequency of the VCO of such magnitude and sign as to reduce the detected phase difference.

Fractional-N (F-N) synthesizers based on the above-described PLL frequency synthesis techniques have been in favor for some time because, inter alia, they provide for non-integer division of the VCO output, thereby providing greater flexibility in choosing VCO output frequencies, and allowing the use of higher frequency reference sources with the concomitant potential for wider bandwidth and faster loop locking times. Other background aspects of RF synthesizers (and, in particular, F-N synthesizers), and their implementation and use, are presented in B. Razavi, RF Microelectronics, Prentice-Hall PTR, 1998, especially pp. 269–297, and in incorporated related patent applications (i–iv) cited above.

FIG. 1 shows a prior art F-N synthesizer arrangement in which a reference signal, e.g., from stable frequency source is applied on input 135 as one input to a phase detector 130. The other input to phase detector 130 is a frequency divided output from programmable divider 120 on path 125. Divider 120, in turn, receives an input from the output of VCO 100, which output is the frequency-controlled output of the synthesizer of FIG. 1. The integer part of the division ratio is applied on line 175 and input reflecting the fractional part of the division ratio is applied on line 155. More specifically, fractional sequence generator 150 responds to an applied fractional divisor input on lead 170 to provide a time-variable sequence of integer values, which, when applied through adder 160 allow a variable divisor to be realized in divider 120. Typically, fractional sequence generator 150 is clocked by the output of divider 120, and a new integer divisor value is provided for each such clock cycle. The overall effect of the application of this time-variable control of the integer divisor in divider 120 is to apply a divisor to divider 120 that has an average value equal to the sum of the integer and fractional inputs on 175 and 170, respectively.

In operation, the prior art synthesizer of FIG. 1 controls the frequency of VCO 100 in response to varying integer divisors by applying a time-variable frequency divided version of the output from VCO 100 to phase detector 130. In comparing phase information for the frequency divided input from divider 120 with the reference signal on input 135, phase detector 130 develops an error signal that is smoothed in low pass loop filter 140 and applied to VCO 100 in such manner as to reduce the phase error between the reference signal and the frequency divided signal from divider 120. In doing so, the output from VCO 100 tracks the desired frequency variations specified by fractional inputs on input 170.

As will be appreciated by those skilled in the art, F-N synthesizers using varying integer divisors to provide an effective fractional divisor produces undesired signal components characterized as quantization noise or spurious frequency tones. A number of techniques have been proposed and implemented that seek to minimize or mitigate effects of such spurious noise components. Among such remedial techniques are some for introducing correction signals tending to cancel spurious signals. Razavi, supra at pp. 282–283, describes techniques for reducing quantization noise by using a sigma-delta modulator to control division in a F-N synthesizer. An ideal sigma-delta-controlled fractional sequence generator has a z-domain noise transfer function given by $$Y(z)=Q_n(z)(1-z^{-1})^n, \qquad (\text{Eq. 1})$$

where Q(z) is white noise and n is the order of the sigma-delta modulator. Such an ideal sigma-delta modulator-controlled fractional sequence generator has a signal transfer function having the form $$Y(z)=X(z)z^{-n}, \qquad (\text{Eq. 2})$$

where X(z) is the input. Likewise, U.S. Pat. No. 4,965,531 issued Oct. 23, 1990 to T. A. D. Riley, discloses use of a second or higher sigma-delta modulator to control the division ratio in a F-N synthesizer in seeking to reduce quantization noise. These and other sequence generator techniques offer stability, optimal noise shaping, power consumption and other implementation difficulties in some applications.

FIG. 2 shows a prior art fractional sequence generator 200 having improved control of spurious signals. The fractional sequence generator of FIG. 2, is based generally on aspects of a F-N synthesizer circuit arrangement shown in U.S. Pat. No. 4,609,881 issued Sep. 2, 1986 to J. N. Wells, which patent is hereby incorporated by reference as if set forth in its entirety herein. The sequence generator of FIG. 2 includes an accumulator structure 210 having a plurality of accumulators—each accumulator comprising an n-bit bank of D flip-flops (an n-bit register), 230-$i$, $i$=1, 2, and 3 and a respective n-bit adder 225-$i$, $i$=1, 2, and 3. Adder 225-1 receives a fractional divisor value $f$ (the least significant bits of a divisor of the form N.$f$, where N is an integer) on the C input path 215 during a current clock cycle of the output of divider 120. Clock signals corresponding to the output of divider 120 are provided as inputs on $F_y$ input 220. The value $f$ on input 215 is added to the previous contents of n-bit register 230-1 and the result is stored in register 230-1. In addition, when register 230-1 overflows (provides a carry-out indication on recombination output CO1), that signal is immediately applied to adder 240 at an input labeled +1. The set of recombination paths is conveniently referred to as recombination network 205.

As further shown in FIG. 2, the sum generated by adder 225-1 is also provided as an input to adder 225-2, where it is combined with the prior contents of register 230-2 during the following clock cycle. Again, the result of the addition is stored back in register 230-2 and a carry indication is provided on recombination path CO2 when overflow of adder 225-2 occurs. This carry indication is applied to an input to adder 240 labeled +1. In addition, the same overflow signal on CO2 is applied to a −1 input to adder 240 after a delay of one additional clock cycle. Such additional delay of one clock cycle is provided by delay flip-flop 250.

In similar fashion, adder 225-3 receives the result of the addition performed at adder 225-2 and adds it to the prior contents of register 230-3. Again, the result of the addition is stored back to register 230-3, and, when a carry-out occurs from adder 225-3, recombination path CO3 supplies the carry-out signal to a +1 input to adder 240. In addition, the CO3 recombination path provides the carry-out indication to delay flip-flop 260, thereby providing the carry out signal to a −2 input to adder 240 after an additional clock cycle. Further, the delayed CO3 signal on the output of flip-flop 260 is also provided as an input to delay flip-flop 270 where it provides the carry-out signal to a +1 input to adder 240 after yet another clock cycle (a total delay of two clock cycles).

Each of the carry-out signals from adders 225-$i$ causes adder 240 to provide an output on SEQ path 245 to temporarily increment or decrement the integer divisor applied through adder 160 to divider 120 in FIG. 1. The magnitude and sign of an increment or decrement during any clock cycle is determined as the sum of increments and decrements indicated by the weights for all recombination paths supplying a carry-out signal, the weights being associated with a Pascal's Triangle. These integer divisor changes advantageously average to the desired fractional portion over time, and, in so doing, provide reduced quantization noise compared with prior F-N techniques. See further the discussion of Pascal sequence coefficients in incorporated U.S. Pat. No. 4,609,881. Further, the structures illustrated in FIG. 2 offer desirable implementation characteristics for many applications. Such characteristics include robust stability for any number of accumulators (the order of the sequence generator).

However, a z-domain frequency response, Y(z), of fractional sequence generators of the type shown in FIG. 2, for an input of X(z) can be shown to assume the form $$Y(z)=X(z)(3z^{-1}-3z^{-2}+z^{-3})+Q_1(z)(1-z^{-1})^3+Q_2(z)(1-z^{-1})^3+Q_3(z)(1-z^{-1})^3 \quad \text{(Eq.3)}$$

where $Q_j(z)$ terms represent quantization noise terms associated with the jth accumulator. Further, it can readily be determined that the resulting noise components $Q_j$ contribute noise to the output signal that does not have preferred sigma-delta-like noise characteristics.

It is therefore desired to realize advantages of the circuit arrangements of FIG. 2 while simplifying its frequency response characteristics to more nearly resemble those of sigma-delta sequence generators.

SUMMARY OF THE INVENTION

Limitations of the prior art are overcome and a technical advance is made in accordance with the present invention, typical embodiments of which are described below.

In accordance with one illustrative embodiment of the present invention, a fractional sequence generator of the type shown in FIG. 2 is modified by the addition of delay elements to better align carry-outs from accumulators other than the last accumulator. Using this modification, a sequence generator is realized that retains low circuit complexity and power consumption characteristic of some cascaded-accumulator sequence generator implementations while exhibiting a desired sigma-delta-like quantization noise spectrum.

In accordance with an aspect of illustrative embodiments of the present invention improved structures will be realized for sequence generators having a higher number of recombination paths, while continuing to exhibit simplified frequency response characteristics.

BRIEF DESCRIPTION OF THE DRAWING FIGURES

The above-summarized invention will be more fully understood upon consideration of the following detailed description and the attached drawing wherein.

DETAILED DESCRIPTION

The following detailed description and accompanying drawing figures depict illustrative embodiments of the present invention. Those skilled in the art will discern alternative system and method embodiments within the spirit of the present invention, and within the scope of the attached claims, from consideration of the present inventive teachings.

Figure 2:
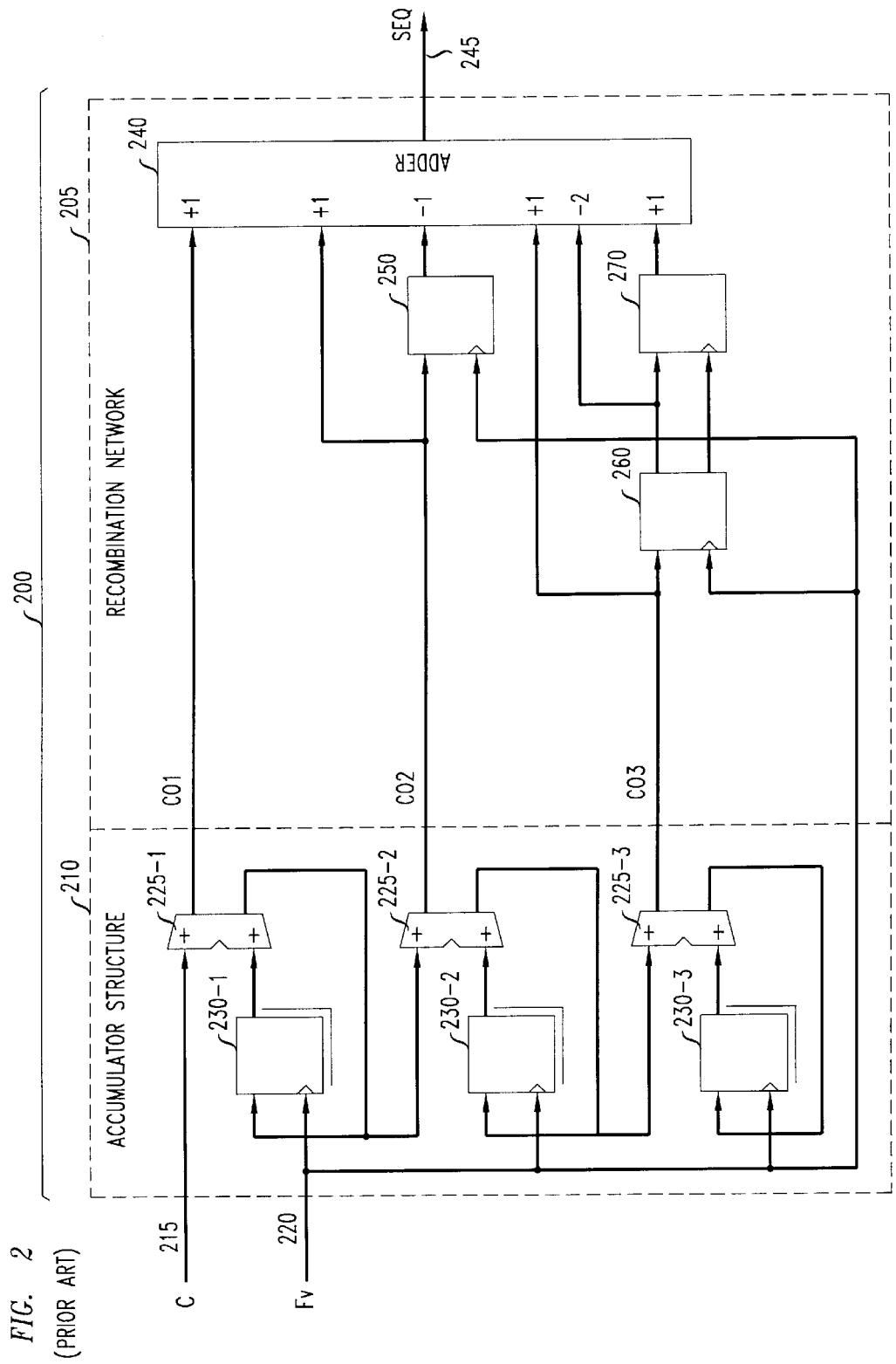
FIG. 2 shows a prior art fractional sequence generator for use in F-N synthesizers such as that shown in FIG. 1.
Figure 3:
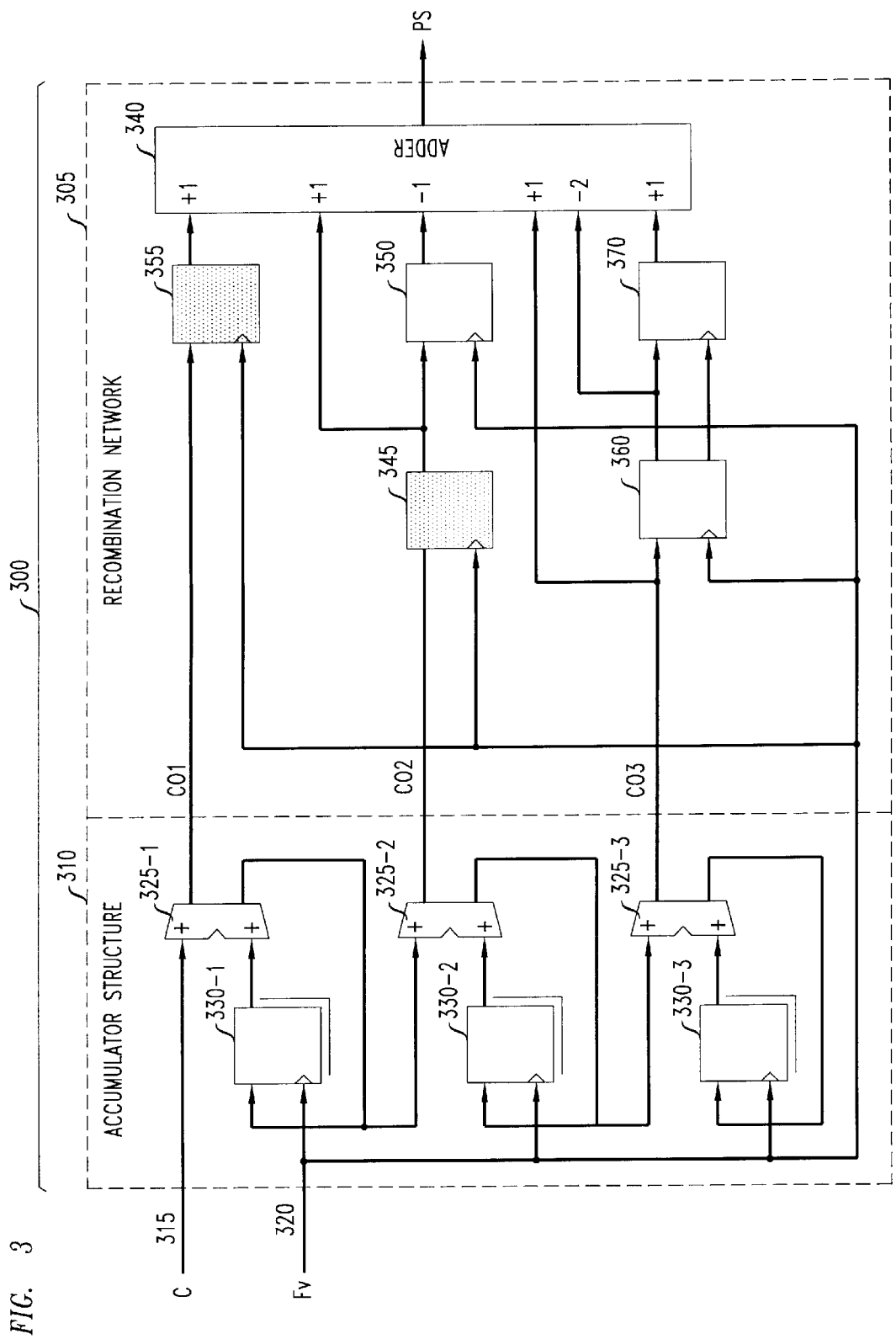
FIG. 3 shows an improved fractional sequence generator in accordance with an illustrative embodiment of the present invention.

FIG. 3 shows a modified version 300 of the fractional sequence generator 200 of FIG. 2. Once again, an accumulator structure in FIG. 3 presents a 3-accumulator configuration by way of illustration, with each accumulator again comprising a bank of n-bit D flip-flops (an n-bit register), 330-$i$, $i$=1, 2, and 3 and corresponding n-bit adders 325-$i$, $i$=1, 2, and 3. These accumulators perform in the same fashion as corresponding accumulators described above in connection with FIG. 2. Further carry-out signals from adders 325-$i$ (e.g., one-bit signals) are clocked during the next clock interval over recombination paths within recombination network 305 to an adder 340 having adder weights of the same kind as in the circuit of FIG. 2. Delay elements 350, 360 and 370 provide the same one-clock cycle delays as corresponding elements 250, 260 and 270 provide in the circuit of FIG. 2.

In accordance with one aspect of an illustrative embodiment of the present invention, additional delay elements 345 and 355 are added to the circuit arrangement of FIG. 2. Thus, carry-out signals from all adders 325-*i* in accumulator structure 310, other than the last such adder (325-3, for the example shown in FIG. 3), experience an additional delay in their respective recombination paths to adder 340. As will now be demonstrated, this augmentation of the sequence generator of FIG. 2 gives rise to the desired frequency response.

Figure 1:
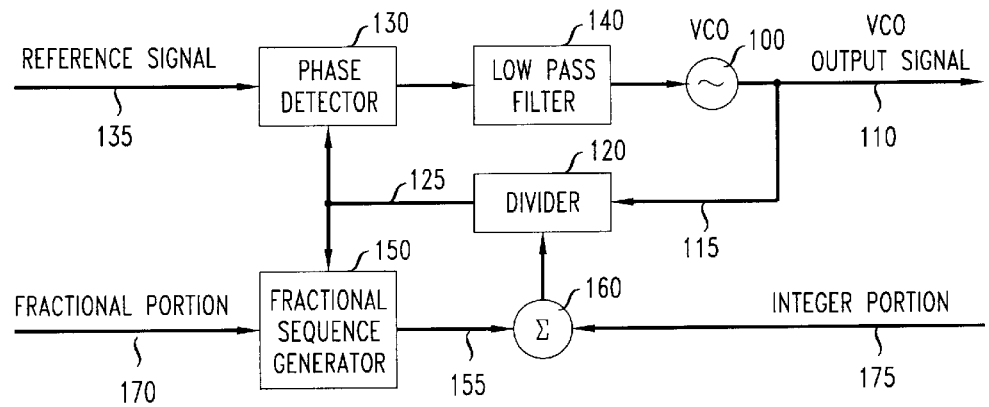
FIG. 1 shows a prior art F-N frequency synthesizer.
Figure 4:
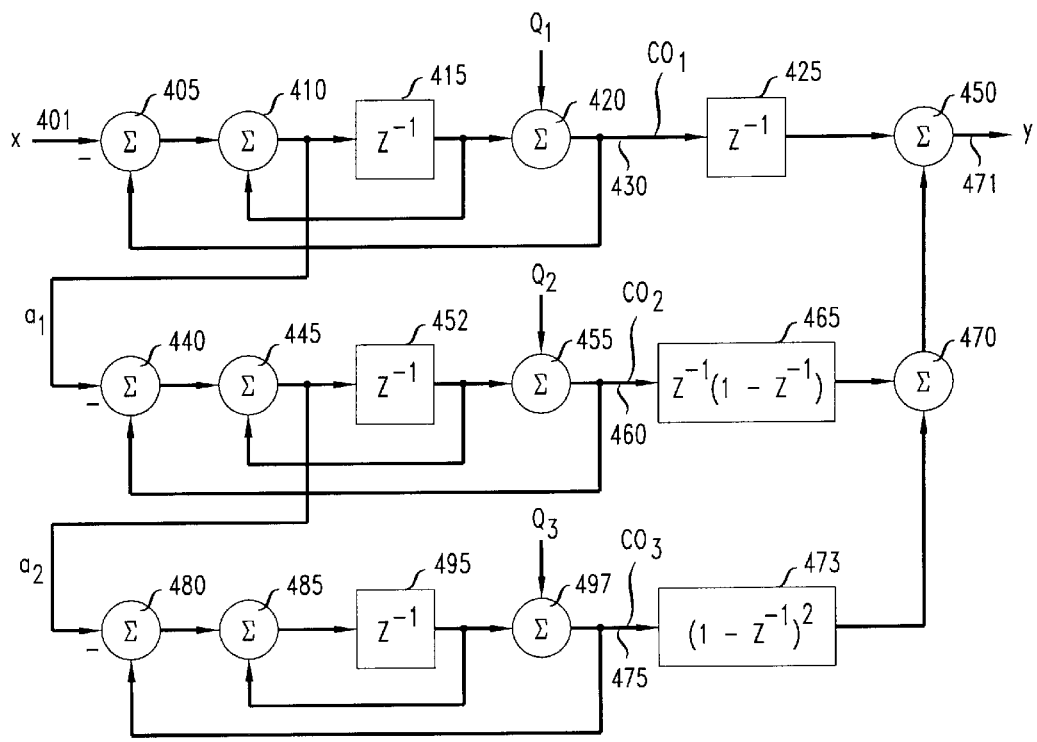
FIG. 4 shows a linearized equivalent representation of the fractional sequence generator of FIG. 3 that proves useful for deriving the improved frequency response of the sequence generator of FIG. 3.

FIG. 4 is a linearized equivalent representation of the improved frequency sequence generator of FIG. 3. In FIG. 4 accumulators in the accumulator structure 310 of FIG. 3 are replaced by non-delaying integrators (adder 410 with delay 415, adder 445 with delay 452, and adder 485 with delay 495); register flip-flops of FIG. 3 appear as unit delays 415, 452 and 495. Adders 405, 440 and 480 perform adjustments to stored accumulator totals when a carry-out signal is generated on respective recombination paths $CO_j$, j=1, 2, 3. Quantization noise $Q_j$, j=1, 2, 3, contributed at each of the accumulators of FIG. 3 is shown as added at adders 420, 455 and 497. Other delays in recombination paths in FIG. 3, and input weightings to adder 340 in FIG. 3, are reflected in elements 425, 465 and 473. That is, the Pascal triangle coefficients taught in the above-cited U.S. patent Outputs from the several recombination paths (outputs from delay elements 425, 465 and 473 are summed in adders 470 and 450 to produce the fractional sequence generator output Y on 471 corresponding to the input X applied at 401.

Application of well-known z-domain analysis techniques yields a frequency response function for the circuit of FIG. 3 in terms of its linearized equivalent shown in FIG. 4 that may be represented as $$Y(z)=X(z)z^{-3}+Q(z)(1-z^{-1})^3 \quad \text{(Eq. 4)}$$

A comparison of the frequency response function of Eq. 4 for the improved sequence generator circuit of FIGS. 3 and 4 with the frequency response function of Eq. 3 for the prior art sequence generator of FIG. 2 shows the simplified, improved response for the circuit of FIGS. 3 and 4. Thus, advantages of sigma-delta sequence generators are realized in accordance with present inventive teachings while maintaining desirable structural aspects (e.g., robust stability, and lower circuit complexity, implementation area, and power consumption) of sequence generators of the type shown in FIG. 2.

While the above describes illustrative embodiment of the present invention includes three accumulators, it is well known to include only two or to include more than three accumulators, and corresponding recombination paths, while also scaling weights for adder 340 in accordance with sequential rows of Pascal's triangle. Thus, for example, a four-accumulator sequence generator will apply adder increments (decrements when negative) of +1, −3, +3, and −1 in response to carry-out indications from such a fourth accumulator, with such increments (decrements) being applied after respective delays of 0, 1, 2, and 3 clock cycles.

What is claimed is:

1. A fractional sequence generator comprising
    a first n-bit accumulator, $A_1$, for adding a fractional multi-bit input word to a previously accumulated total to provide a new n-bit total, $N_1$, and a carry-out signal, $CO_1$, when said $N_1$ overflows said n-bit accumulator,
    an ordered plurality of additional n-bit accumulators, $A_j$, j=2, 3, . . . , K, each $A_j$ adding an n-bit input word to a previously accumulated total to provide a respective new n-bit total, $N_j$, and a respective carry-out signal $CO_j$ when said, $N_j$ overflows said $A_j$, $A_2$ receiving said $N_1$ as an input word, and each $A_j$, j>1 receiving $N_j$−1 as an input word, and
    a recombination network comprising
        an adder providing an output equal to the sum of weighted increments and decrements, each increment and decrement associated with a respective selectively delayed one of said $CO_j$, and
        a plurality of delay elements for selectively delaying said $CO_j$, $CO_K$ experiencing K−1 units of delay, $CO_j$, j<K, experiencing delays of 1, . . . , j units of delay, for j=1, 2, 3, . . . , K−1.

2. The sequence generator of claim 1 further comprising means for applying said output of said adder to adjust a divisor of a divider.

3. The sequence generator of claim 2 wherein said units of said delay comprise cycles of the output of said divider.

4. The sequence generator of claim 3 wherein each of said accumulators performs an addition during each of said cycles of the output of said divider.

5. The sequence generator of claim 2 wherein said divider controls the output frequency of a F-N synthesizer.

6. The sequence generator of claim 1 wherein each increment and decrement associated with one of said $CO_j$ comprises increments and decrements associated with the jth row of Pascal's triangle.

7. The sequence generator of claim 6 wherein said jth row of Pascal's triangle comprises j weights, and wherein the least-delayed $CO_j$ signal causes said adder to increment said output of said adder by one.

8. A F-N synthesizer comprising
    a phase detector receiving inputs from a frequency divider and a reference source and generating an output based on phase differences between said inputs,
    a voltage controlled oscillator (VCO) for generating output signals based on said output of said phase detector,
    a divider receiving said output signals from said VCO as an input and providing a divided version of said output signals from said VCO as an output,
    a divisor control circuit for supplying a time-varying integer divisor signal to said divider, said divisor control circuit comprising means for successively combining at least one integer input with a time sequence of integer increment and decrement inputs to form said time-varying integer divisor signal,
    a fractional sequence generator for supplying said time sequence of integer increment and decrement inputs to said divisor control circuit, said fractional sequence generator comprising
        a first n-bit accumulator, $A_1$, for adding a fractional multi-bit input word to a previously accumulated total to provide a new n-bit total, $N_1$, and a carry-out signal, $CO_1$, when said $N_1$ overflows said n-bit accumulator,
        an ordered plurality of additional n-bit accumulators, $A_j$, j=2, 3, . . . , K, each $A_j$ adding an n-bit input word to a previously accumulated total to provide a respective new n-bit total, $N_j$, and a respective carry-out signal $CO_j$ when said, $N_j$ overflows said, $A_j$, $A_2$ receiving said $N_1$ as an input word, and each $A_j$, j>1 receiving $N_j$−1 as an input word, and
        a recombination network comprising an adder providing an output equal to the sum of weighted increments and decrements, each increment and decrement associated with a respective selectively delayed one of said $CO_j$, and a plurality of delay elements for selectively delaying said $CO_j$, $CO_K$ experiencing K−1 units of delay, $CO_j$, j<K, experiencing delays of 1, ..., j units of delay, for j=1, 2, 3, ..., K−1.

9. The F-N synthesizer of claim 8 wherein said units of delay comprise cycles of said output to said driver.

10. The F-N synthesizer of claim 8 wherein each of said accumulators performs an addition during each of said cycles of the output of said divider.

* * * * *